United States Patent
Tsai et al.

(10) Patent No.: US 8,130,509 B2
(45) Date of Patent: Mar. 6, 2012

(54) PACKAGE CARRIER

(75) Inventors: Tsung-Fu Tsai, Yunlin County (TW);
Chau-Jie Zhan, Taipei County (TW);
Jing-Yao Chang, Taipei County (TW);
Tao-Chih Chang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 393 days.

(21) Appl. No.: 12/483,261

(22) Filed: Jun. 12, 2009

(65) Prior Publication Data

US 2010/0163292 A1 Jul. 1, 2010

(30) Foreign Application Priority Data

Dec. 31, 2008 (TW) .............................. 97151845 A

(51) Int. Cl.
*H05K 7/10* (2006.01)

(52) U.S. Cl. ........ 361/767; 361/808; 257/529; 257/686; 257/692; 257/737; 257/777; 438/106; 438/613

(58) Field of Classification Search .................. 361/767, 361/808; 257/529, 686, 692, 737, 777; 438/106, 438/613
See application file for complete search history.

(56) References Cited

U.S. PATENT DOCUMENTS

| | | | |
|---|---|---|---|
| 6,818,996 B2 | 11/2004 | Mertol et al. | |
| 6,828,677 B2 | 12/2004 | Yap et al. | |
| 6,960,828 B2 | 11/2005 | Nair et al. | |
| 7,030,492 B2 | 4/2006 | Huang | |
| 7,122,460 B2 | 10/2006 | Hua | |
| 7,223,695 B2 | 5/2007 | Zhong et al. | |
| 7,242,097 B2 | 7/2007 | Hua | |
| 7,297,631 B2 | 11/2007 | Nair et al. | |
| 2005/0029677 A1 | 2/2005 | Huang | |
| 2006/0027933 A1 | 2/2006 | Chen et al. | |
| 2006/0246706 A1 | 11/2006 | Ke et al. | |
| 2007/0045840 A1 | 3/2007 | Varnau | |
| 2010/0207266 A1* | 8/2010 | Chang et al. | 257/692 |

* cited by examiner

*Primary Examiner* — Xiaoliang Chen
(74) *Attorney, Agent, or Firm* — Jianq Chyun IP Office

(57) ABSTRACT

A package carrier including a substrate, at least an under bump metallurgic (UBM) layer and at least a conductive bump is provided. The substrate has a conductive structure and at least a pad connected with the conductive structure. A region of the pad connected with the conductive structure is a signal source region. The UBM layer is disposed on the pad and includes a first conductive pattern and a second conductive pattern. A side wall of the second conductive pattern is directly connected to a side wall of the first conductive pattern, and the second conductive pattern is disposed close to the signal source region. The conductivity of the second conductive pattern is smaller than the conductivity of the first conductive pattern. The conductive bump is disposed on the UBM layer.

23 Claims, 14 Drawing Sheets

PACKAGE CARRIER

CROSS-REFERENCE TO RELATED APPLICATION

This application claims the priority benefit of Taiwan application serial no. 97151845, filed on Dec. 31, 2008. The entirety of the above-mentioned patent application is hereby incorporated by reference herein and made a part of this specification.

BACKGROUND OF THE INVENTION

1. Technical Field

The disclosure is related to a package carrier, and particularly to a package carrier having an under bump metallurgic layer (UBM layer).

2. Background Art

As technology advances, all sorts of electronic products are developed towards multifunction, characterized by miniaturization, light weight, thin thickness, high speed, high performance, high density, low cost and the like. Hence, in order for chips in electronic products to be able to transmit or receive more signals, contacts electrically connecting chips and package carriers are also developed towards high density.

The flip chip bonding technology mainly arranges a plurality of pads on the chip in area array to respectively dispose the pads on the active surface of the chip, and then a UBM layer and conductive bumps are respectively formed in sequence on the pads. Afterwards, the conductive bumps are used to connect with the pads on the package carrier so that the chip is electrically connected to the package carrier through the conductive bumps. Since the conductive bumps are arranged on the active surface of the chip in area array, the flip chip bonding technology is suitable for the chip package structure of high contact count and high contact density, such as the flip chip/ball grid array type package which has been extensively used in the semiconductor package industry. Additionally, compared with the wire bonding technology, the conductive bumps can provide a shorter transmission path between the chip and the package carrier, such that the flip chip bonding technology can enhance the electrical performance of the chip package.

FIG. 1 is a schematic cross-sectional view of a conventional flip chip package. Referring to FIG. 1, a conventional flip chip package 1 includes a chip 10, a substrate 20, an under bump metallurgic (UBM) layer 30, a conductive bump 40 and an underfill 50. The chip 10 has a chip pad 12, a wire structure 14 connected with the chip pad 12, and a first passivation layer 16. The first passivation layer 16 has an opening 16A to expose a portion of the chip pad 12. The UBM layer 30 is disposed between the chip pad 12 and the conductive bump 40 and constituted by composite metal layers, i.e., an adhesive layer 32, a carrier layer 34 and a wetting layer 36. The substrate 20 has a substrate pad 22 and a second passivation layer 24. The chip pad 12 and the substrate pad 22 corresponding thereto can render the chip 10 and the substrate 20 electrically connected with each other through the conductive bump 40. The underfill 50 is disposed between the chip 10 and the substrate 20 and encapsulates the conductive bump 40.

It should be noted that as the package technology develops to be more precise, the size of the conductive bump 40 also becomes smaller. When the chip 10 accelerates its operation, a large amount of current is formed passing through the UBM layer 30, such that current crowding would occur close to a region 18 of the wire structure 14. In other words, the current density in this region increases, resulting in grain boundary diffusion among metal atoms, i.e., electro-migration. Consequently, the metal atoms of the UBM layer 30 are lost due to electro-migration caused by long periods of current influence, and even voids may be formed and cracks may be extended. Especially at the end close to the wire structure 14, more metal atoms are lost than at the end far away from the wire structure 14, thus affecting the reliability of the flip chip package 1.

SUMMARY

In one embodiment, a package carrier including a substrate, at least one UBM layer and at least one conductive bump is provided. The substrate has a conductive structure and at least one pad connected with the conductive structure, wherein a region of the pad connected with the conductive structure is a signal source region. The UBM layer is disposed on the pad and includes a first conductive pattern and a second conductive pattern. A side wall of the second conductive pattern is directly connected to a side wall of the first conductive pattern. The second conductive pattern is disposed close to the signal source region, and a conductivity of the second conductive pattern is smaller than a conductivity of the first conductive pattern. The conductive bump is disposed on the UBM layer.

In another embodiment, a package carrier including a substrate, at least one under bump metallurgic layer and at least one conductive bump is provided. The substrate has a conductive structure and at least one pad connected with the conductive structure, wherein a region of the pad connected with the conductive structure is a signal source region. The UBM layer is disposed on the pad and includes a conductive pattern and a multiple-ring structure. The conductive pattern is located on a surface of the pad. The multiple-ring structure is located on a surface of the conductive pattern. The conductivity of the multiple-ring structure is smaller than that of the conductive pattern, and a portion of the multiple-ring structure is close to the signal source region. The conductive bump is disposed on the UBM layer.

In another embodiment, a package carrier including a substrate, at least one UBM layer and at least one conductive bump is provided. The substrate has a conductive structure and at least one pad connected with the conductive structure, wherein a region of the pad connected with the conductive structure is a signal source region. The UBM layer is disposed on the pad and includes a first conductive pattern, a second conductive pattern and a third conductive pattern. The first conductive pattern is located on a surface of the pad. The second conductive pattern is located on a surface of the first conductive pattern. The third conductive pattern is located on the surface of the first conductive pattern. The conductivity of the third conductive pattern is larger than that of the first conductive pattern; the conductivity of the first conductive pattern is larger than that of the second conductive pattern, and the second conductive pattern is closer to the signal source region than the third conductive pattern. The conductive bump is disposed on the UBM layer.

BRIEF DESCRIPTION OF THE DRAWINGS

The accompanying drawings are included to provide a further understanding of the invention, and are incorporated in and constitute a part of this specification. The drawings illustrate embodiments and, together with the description, serve to explain the principles of the invention.

DESCRIPTION OF EMBODIMENTS

The several embodiment provides a package carrier, capable of making current pass through pads and enter an under bump metallurgic (UBM) layer in a uniform density evenly distributed so as to mitigate current crowding.

The UBM layer has the first conductive pattern and the second conductive pattern with two different conductivities, and the second conductive pattern with low conductivity is disposed close to the signal source region. When current from the signal source region passes through the pads and enters the UBM layer, the current density is uniformly distributed in the UBM layer.

Figure 1:
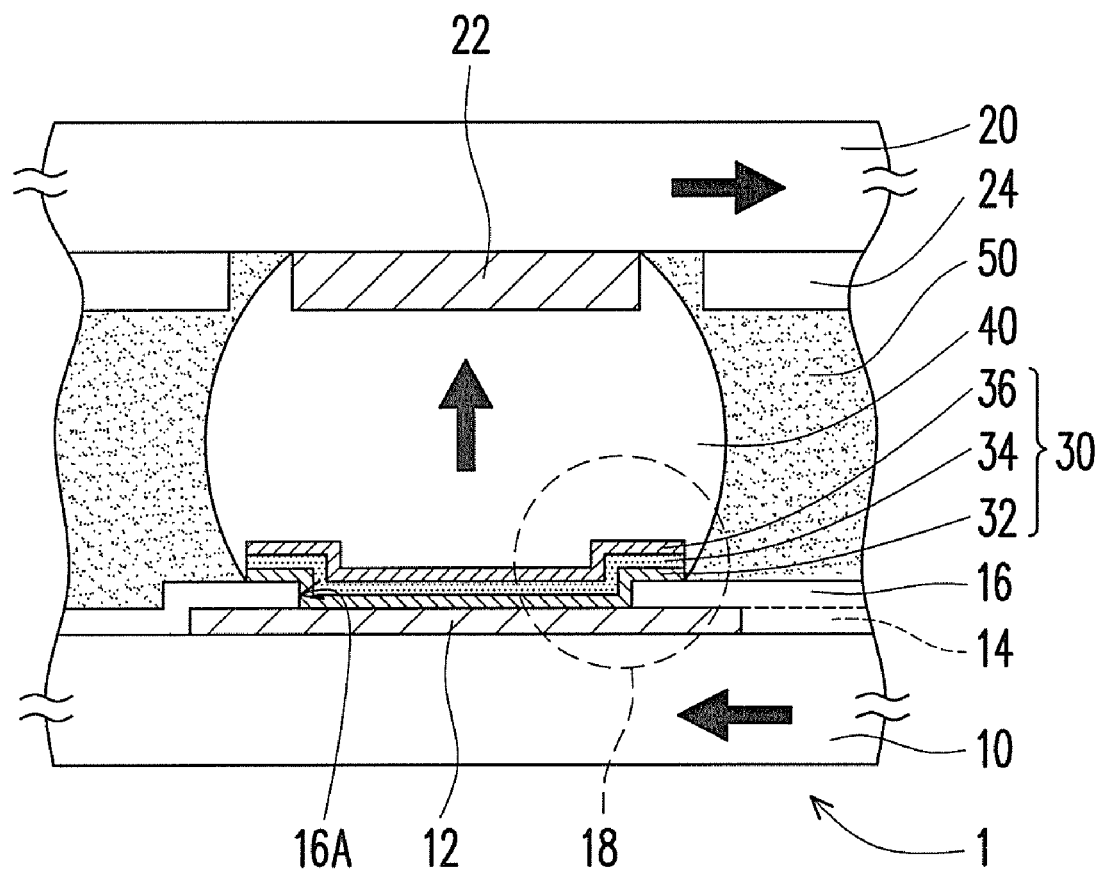
FIG. 1 is a schematic cross-sectional view of a conventional flip chip package.
Figure 2A:
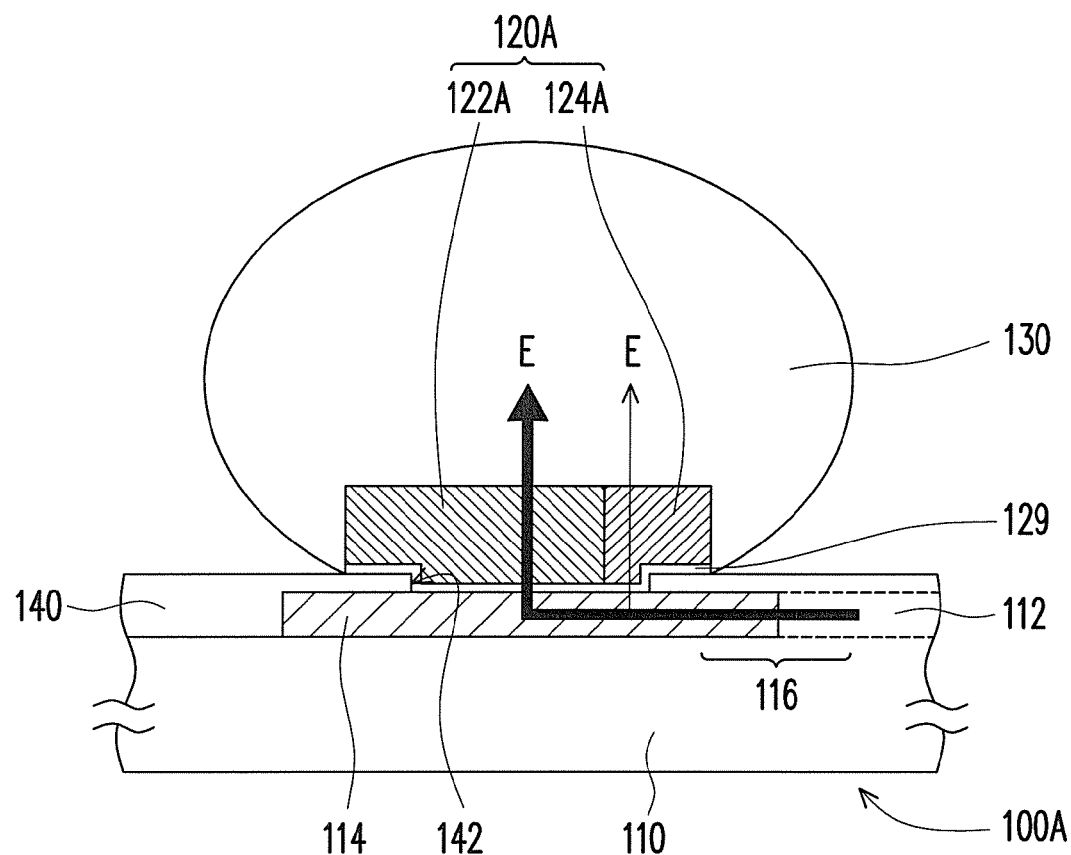
FIG. 2A is a schematic cross-sectional view of a package carrier according to an embodiment.
Figure 2B:
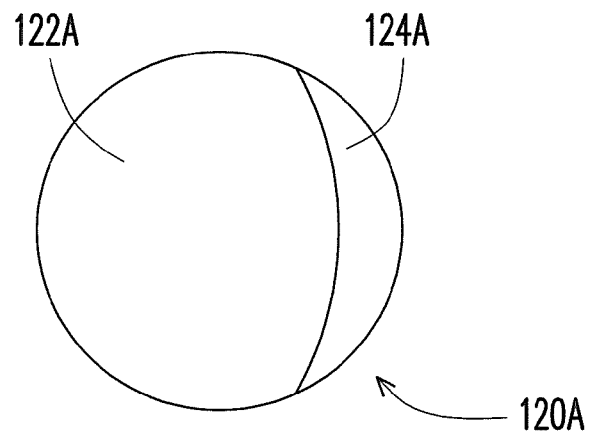
FIG. 2B is a top view of the UBM layer of FIG. 2A.

FIG. 2A is a schematic cross-sectional view of a package carrier according to an embodiment. FIG. 2B is a top view of the UBM layer of FIG. 2A. Referring to both FIGS. 2A and 2B, in the embodiment, a package carrier 100A includes a substrate 110, at least one UBM layer 120A and at least one conductive bump 130.

The substrate 110 has a conductive structure 112 and at least one pad 114 connected with the conductive structure 112, wherein a region of the pad 114 connected with the conductive structure 112 is a signal source region 116. According to the embodiment, the conductive structure 112 and the pad 114 belong to the same layer, e.g., a wire structure. According to other embodiments, the conductive structure 112 can also be a conductive structure located inside the substrate 110, e.g., an interconnect structure or an internal wire structure.

According to the embodiment, the substrate 110 further includes a passivation layer 140 thereon. The passivation layer 140 has an opening 142, and the opening 142 exposes a portion of the pad 114. According to the embodiment, the substrate 110 is a chip or a circuit board, for example. It should be explained that in other embodiments the substrate 110 may also have no passivation layer 140. In other words, the substrate 110 shown by FIG. 2A serves as an example and is not intended to limit the embodiment.

The UBM layer 120A is disposed on the pad 114, and a portion of the UBM layer 120A is located on the pad 114 exposed by the opening 142 of the passivation layer 140. Another portion of the UBM layer 120A is located on the passivation layer 140 over the pad 114. The UBM layer 120A includes a first conductive pattern 122A and a second conductive pattern 124A. A side wall of the second conductive pattern 124A is directly connected to a side wall of the first conductive pattern 122A, and the second conductive pattern 124A is disposed close to the signal source region 116. The first conductive pattern 122A and the second conductive pattern 124A are both single-layered structures. The conductivity of the second conductive pattern 124A is smaller than that of the first conductive pattern 122A. In other embodiments, the first conductive pattern 122A and the second conductive pattern 124A can also be multilayer structures. Moreover, an area of the second conductive pattern 124A occupies 5%-60% of an entire area of the UBM layer 120A.

According to the embodiment, the side wall of the first conductive pattern 122A is directly connected to the side wall of the second conductive pattern 124A, and an upper surface of the first conductive pattern 122A is co-planar with an upper surface of the second conductive pattern 124A. A material of the first conductive pattern 122A is Cu, and a material of the second conductive pattern 124A is Ni, for example. The embodiment does not limit the materials of the first conductive pattern 122A and the second conductive pattern 124A. Both materials can be selected from Cu, Ag, Ni, Al, Ti, W, Cr, Au, Zn, Bi, In, Tn and an alloy of any of the foregoing metals. As long as the selected material of the first conductive pattern 122A and the selected material of the second conductive pattern 124A realize the design that the conductivity of the second conductive pattern 124A is smaller than that of the first conductive pattern 122A, such materials are technical solutions applicable to the embodiment, and do not depart from the scope for which the embodiment seeks protection.

It should be noted that in the embodiment when a current E from the signal source region 116 passes through the pads 114 and enters the UBM layer 120A, as the conductivity of the second conductive pattern 124A is smaller than that of the first conductive pattern 122A, and the second conductive pattern 124A is disposed close to the signal source region 116, a larger portion of the current E flows from the first conductive pattern 122A with high conductivity, and a smaller portion of the current E flows from the second conductive pattern 124A with low conductivity. In other words, an amount of the current E flowing close by the signal source region 116 is smaller than an amount of the current E flowing far away from the signal source region 116. Therefore, the embodiment reduces damage to the UBM layer 120A near the signal source region 116 caused by electro-migration and simultaneously allows the density of the current E to be uniformly distributed in the UBM layer 120A so that the reliability of the package carrier 100A is enhanced.

The conductive bump 130 is disposed on the UBM layer 120A and electrically connected with the substrate 110 through the UBM layer 120A. The material of the conductive bump 130 is lead-tin alloy, for example. In addition, in the embodiment, an adhesive layer 129 is further disposed between the UBM layer 120A and the pad 114 to strengthen the bonding between the UBM layer 120A and the pad 114.

The UBM layer 120A of the embodiment has the first conductive pattern 122A and the second conductive pattern 124A with two different conductivities. The conductivity of the second conductive pattern is smaller than that of the first conductive pattern 122A, and the second conductive pattern 124A is disposed close to the signal source region 116. Hence, when the current E from the signal source region 116 passes through the pad 114 and enters the UBM layer 120A, the amount of the current E flowing close by the signal source region 116 is smaller than that flowing far away from the signal source region 116 so that the density of the current E is distributed uniformly in the UBM layer 120A, thus effectively improving on current crowding. Meanwhile, damage to the UBM layer 120A near the signal source region 116 caused by electro-migration is also reduced so as to enhance the reliability of the package carrier 100A.

It is noted that the embodiment does not limit the form of the UBM layer 120A. Although the UBM layer 120A described in the embodiment is realized as the side wall of the first conductive pattern 122A being directly connected to that of the second conductive pattern 124A, the upper surface of the first conductive pattern 122A being co-planar with that of the second conductive pattern 124A, other known structure designs which can make the current distribute uniformly in the UBM layer 120A are also technical solutions suitable for the embodiment and do not depart from the scope of the embodiment for which protection is sought. Accordingly, other different forms of UBM layers 120B-120H in the embodiment respectively applied to package carriers 100B-100H are further enumerated for illustration as follows.

Figure 3A:
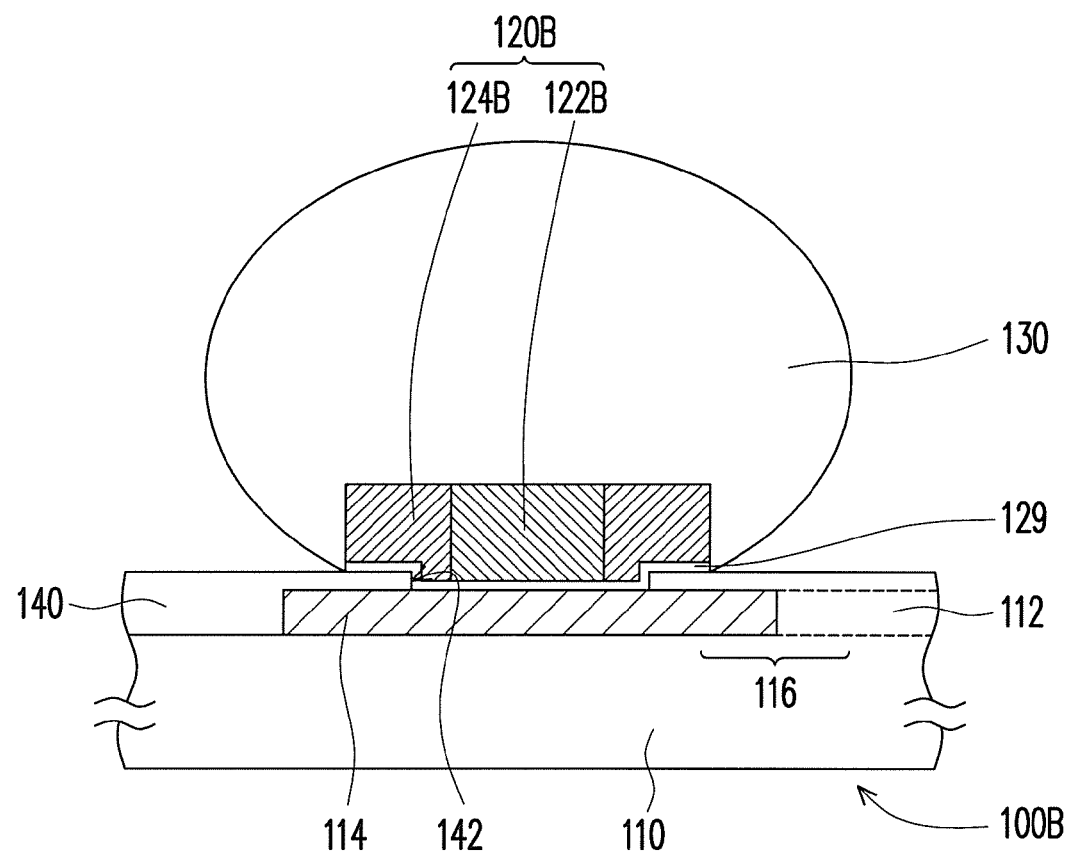
FIG. 3A is a schematic cross-sectional view of a package carrier according to another embodiment.
Figure 3B:
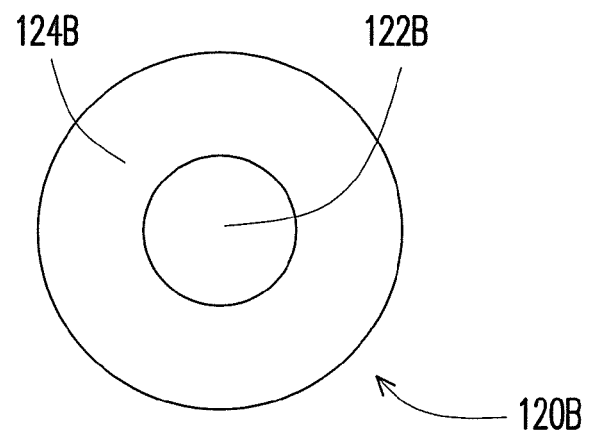
FIG. 3B is a top view of the UBM layer of FIG. 3A.

FIG. 3A is a schematic cross-sectional view of a package carrier according to another embodiment. FIG. 3B is a top view of the UBM layer of FIG. 3A. Referring to both FIGS. 3A and 3B, in the embodiment, a package carrier 100B of FIG. 3A is similar to the package carrier 100A of FIG. 2A. The difference between the two package carriers lies in that a UBM layer 120B of the package carrier 100B in FIG. 3A has a second conductive pattern 124B located around a first conductive pattern 122B, and the upper surface of the second conductive pattern 124B is co-planar with that of the first conductive pattern 122B. In the embodiment, the second conductive pattern 124B is a ring structure and the first conductive pattern 122B is a column structure in the center of the second conductive pattern 124B.

Figure 4A:
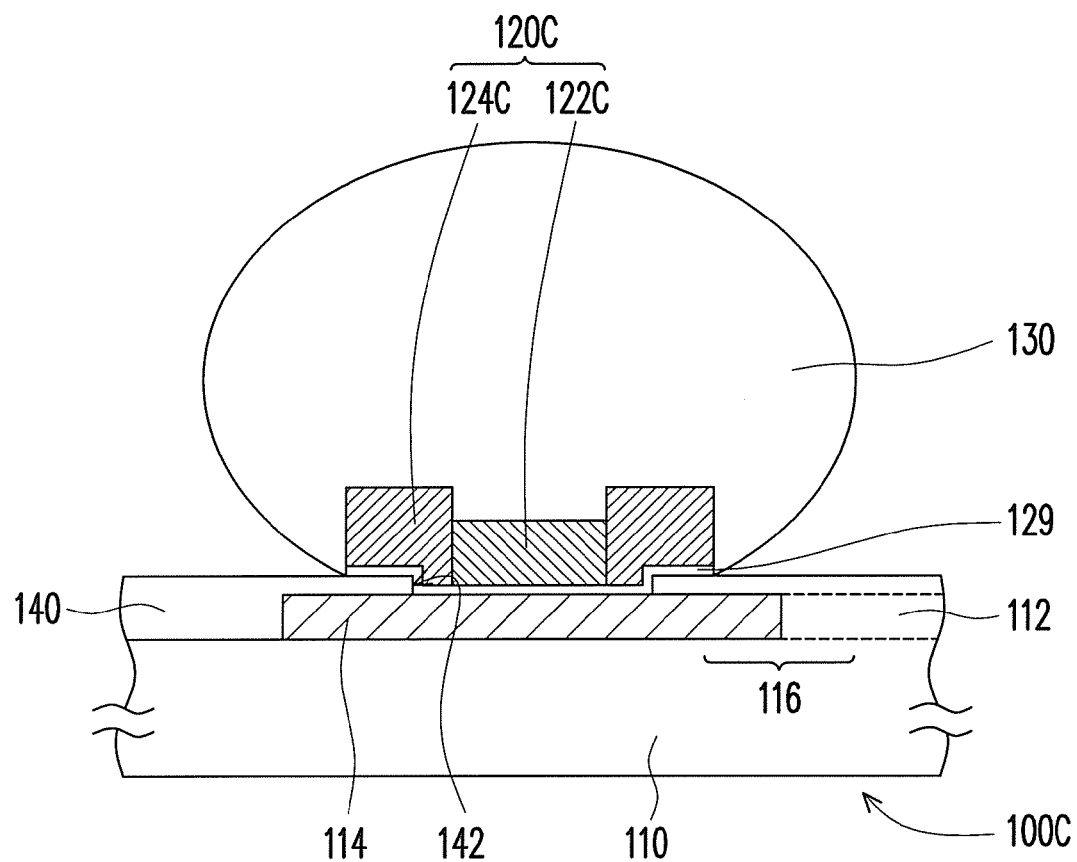
FIG. 4A is a schematic cross-sectional view of a package carrier according to another embodiment.
Figure 4B:
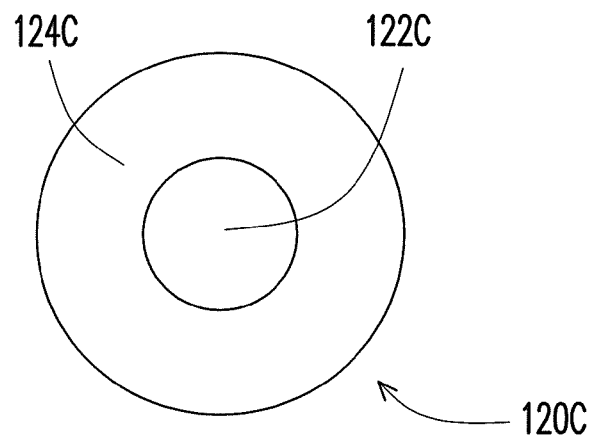
FIG. 4B is a top view of the UBM layer of FIG. 4A.

FIG. 4A is a schematic cross-sectional view of a package carrier according to another embodiment. FIG. 4B is a top view of the UBM layer of FIG. 4A. Referring to both FIGS. 4A and 4B, in the embodiment, a package carrier 100C of FIG. 4A is similar to the package carrier 100A of FIG. 2A. The difference between the two package carriers lies in that a UBM layer 120C of the package carrier 100C in FIG. 4A has a second conductive pattern 124C located around a first conductive pattern 122C. In the embodiment, the second conductive pattern 124C is a ring structure and the first conductive pattern 122C is a column structure in the center of the second conductive pattern 124C. In addition, the upper surface of the second conductive pattern 124C is higher than that of the first conductive pattern 122C.

Figure 5A:
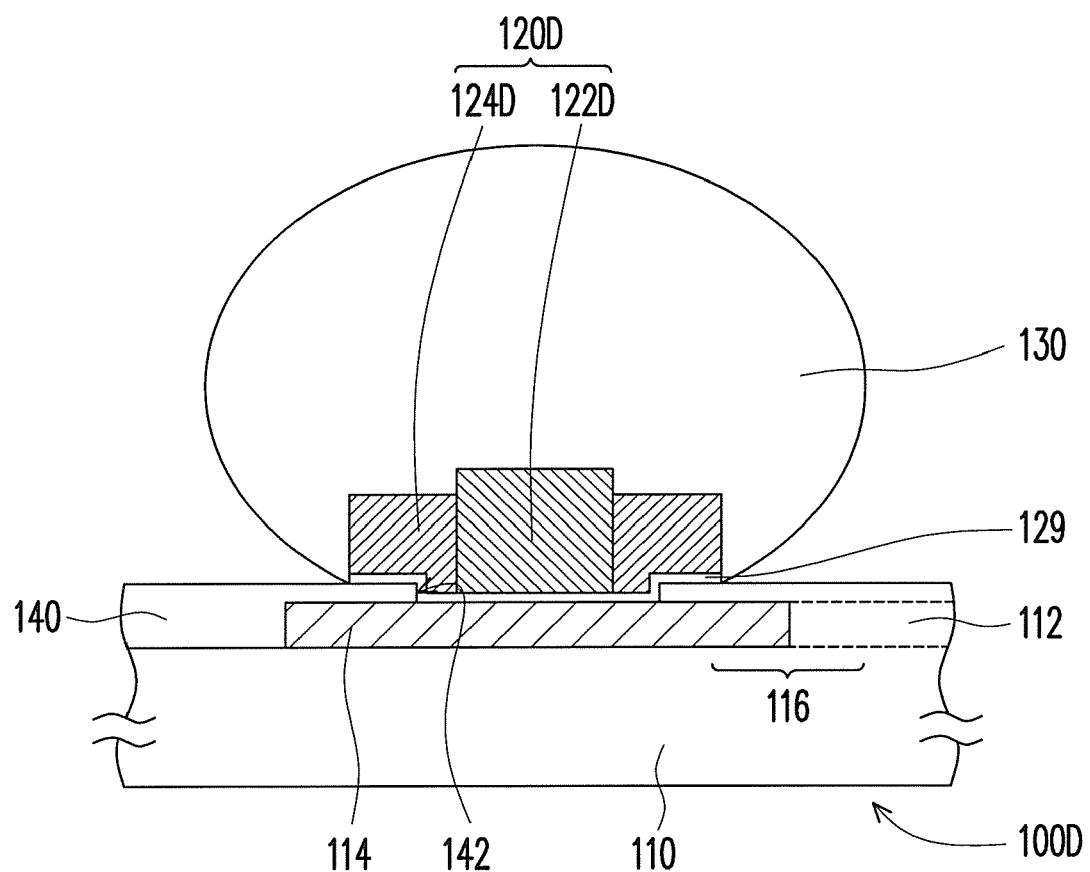
FIG. 5A is a schematic cross-sectional view of a package carrier according to another embodiment.
Figure 5B:
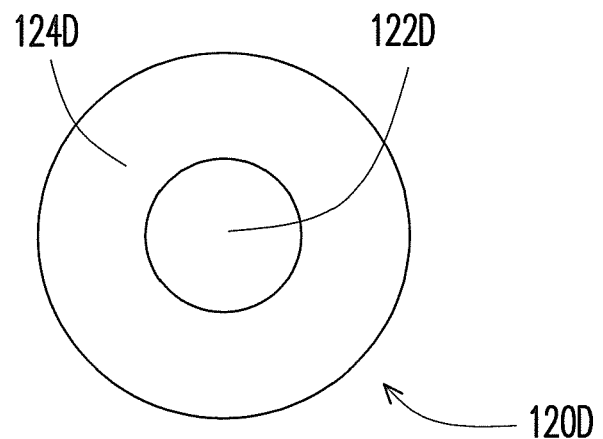
FIG. 5B is a top view of the UBM layer of FIG. 5A.

FIG. 5A is a schematic cross-sectional view of a package carrier according to another embodiment. FIG. 5B is a top view of the UBM layer of FIG. 5A. Referring to both FIGS. 5A and 5B, in the embodiment, a package carrier 100D of FIG. 5A is similar to the package carrier 100A of FIG. 2A. The difference between the two package carriers lies in that a UBM layer 120D of the package carrier 100D in FIG. 5A has a second conductive pattern 124D located around a first conductive pattern 122D. In the embodiment, the second conductive pattern 124D is a ring structure and the first conductive pattern 122D is a column structure in the center of the second conductive pattern 124D. In addition, the upper surface of the second conductive pattern 124D is lower than that of the first conductive pattern 122D.

Figure 6A:
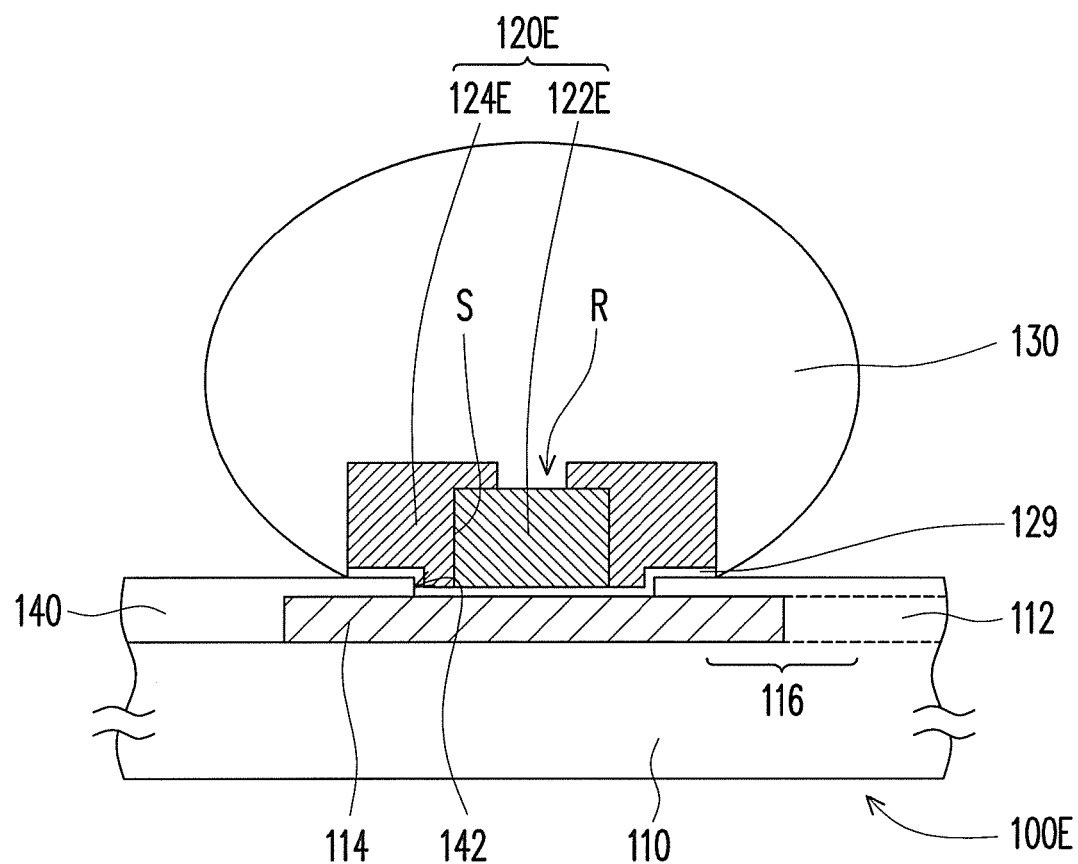
FIG. 6A is a schematic cross-sectional view of a package carrier according to another embodiment.
Figure 6B:
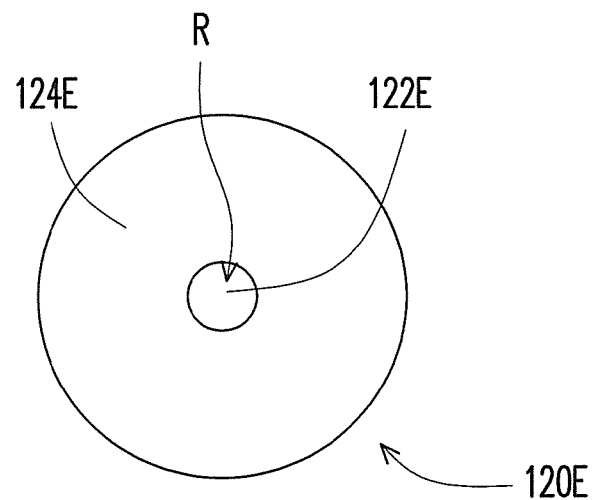
FIG. 6B is a top view of the UBM layer of FIG. 6A.

FIG. 6A is a schematic cross-sectional view of a package carrier according to another embodiment. FIG. 6B is a top view of the UBM layer of FIG. 6A. Referring to both FIGS. 6A and 6B, in the embodiment, a package carrier 100E of FIG. 6A is similar to the package carrier 100A of FIG. 2A. The difference between the two package carriers lies in that a UBM layer 120E of the package carrier 100E in FIG. 6A has a second conductive pattern 124E located around a first conductive pattern 122E, and the second conductive pattern 124E further extends to a portion of the upper surface of the first conductive pattern 122E. In the embodiment, the second conductive pattern 122E has a column space S therein, and the first conductive pattern 124E is disposed inside the column space S and extends to a portion of the upper surface of the first conductive pattern 122E, such that a column recess R enclosed by the second conductive pattern 124E is formed on the upper surface of the first conductive pattern 122E.

Figure 6C:
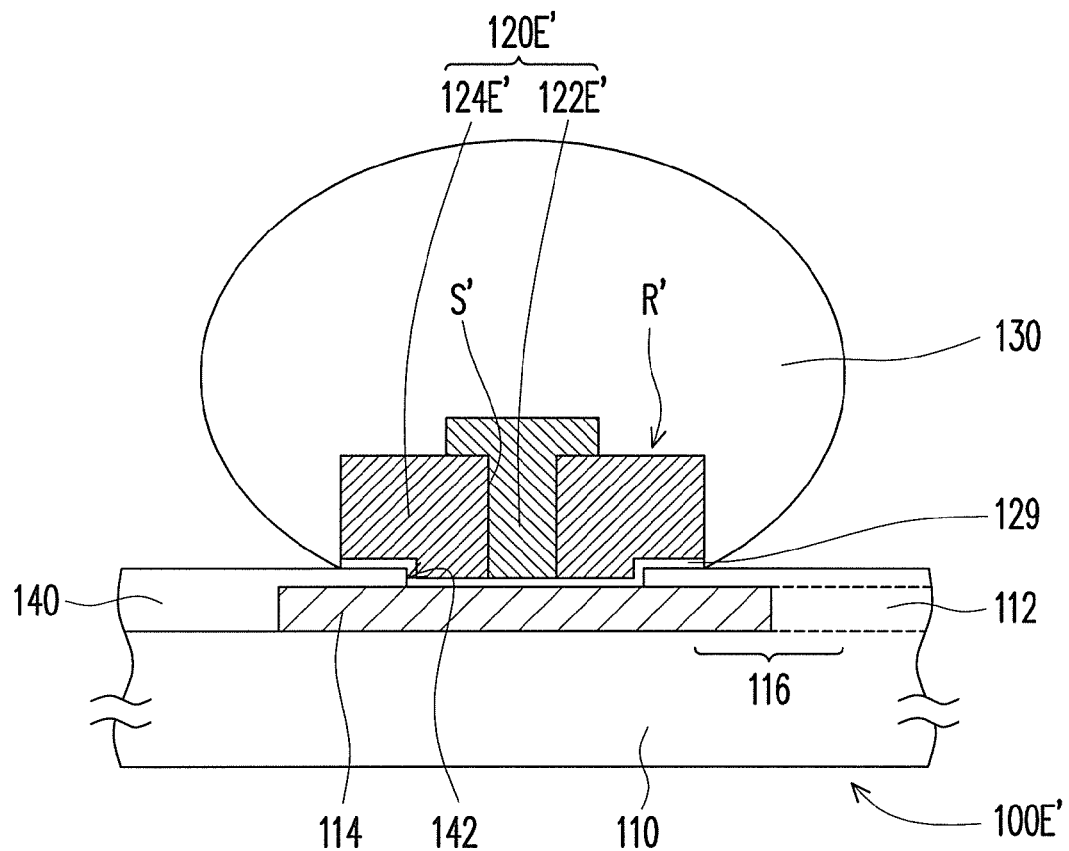
FIG. 6C is a schematic cross-sectional view of a package carrier according to another embodiment of the present invention.
Figure 6D:
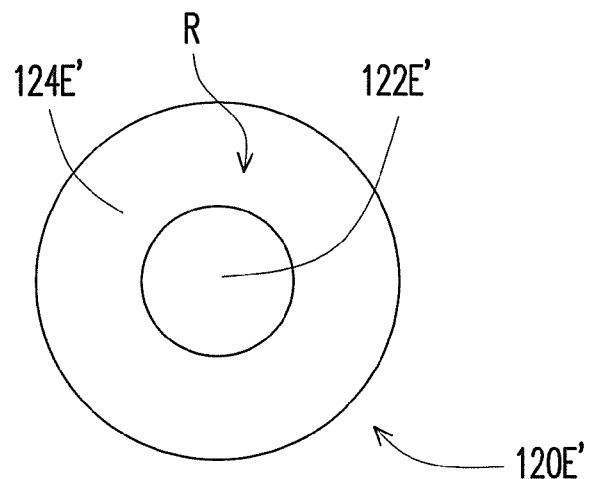
FIG. 6D is a top view of the UBM layer of FIG. 6C.

FIG. 6C is a schematic cross-sectional view of a package carrier according to another embodiment. FIG. 6D is a top view of the UBM layer of FIG. 6C. Referring to both FIGS. 6C and 6D, in the embodiment, a package carrier 100E' of FIG. 6C is similar to the package carrier 100E of FIG. 6A. The difference between the two package carriers lies in that a UBM layer 120E' of the package carrier 100E' in FIG. 6A has a second conductive pattern 124E' located around a first conductive pattern 122E', and the first conductive pattern 122E' further extends to a portion of the upper surface of the second conductive pattern 124E'. In the embodiment, the second conductive pattern 122E' has a column space S' therein, and the first conductive pattern 124E' is disposed inside the column space S' and extends to a portion of the upper surface of the second conductive pattern 124E', such that a ring recess R' surrounding the first conductive pattern 122E' is formed on the upper surface of the second conductive pattern 124E'.

Figure 7A:
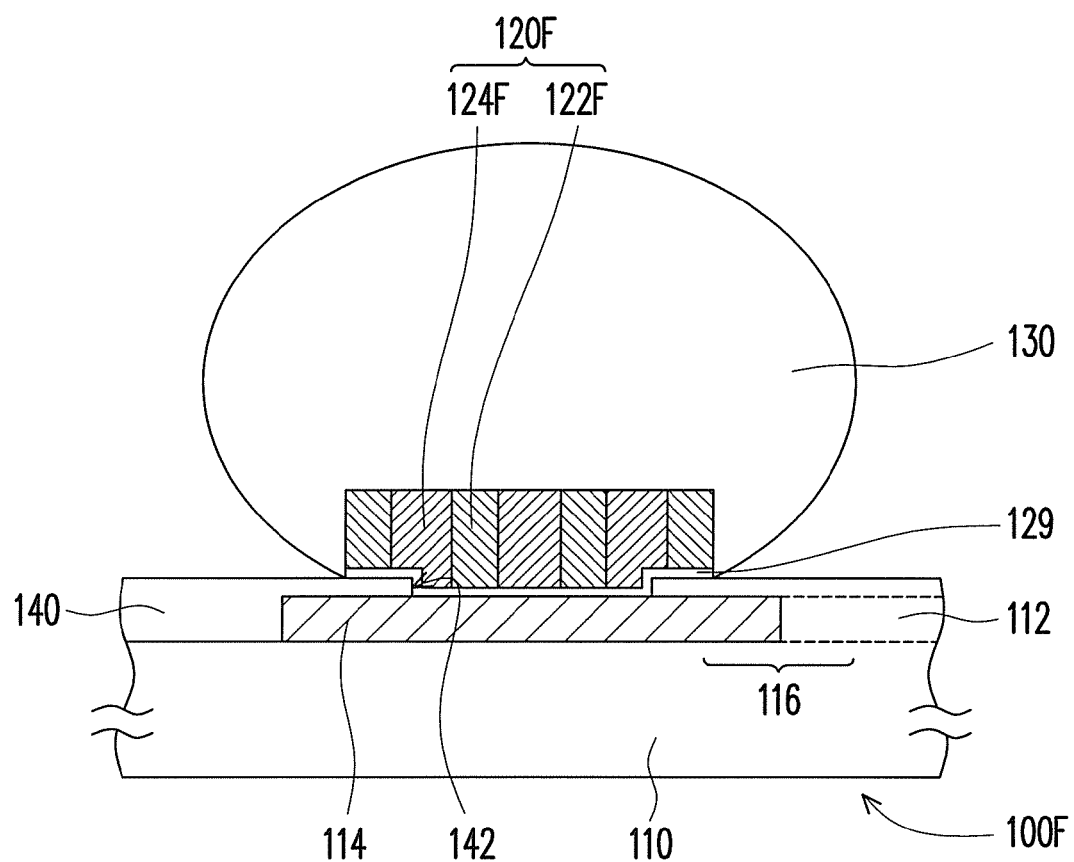
FIG. 7A is a schematic cross-sectional view of a package carrier according to another embodiment.
Figure 7B:
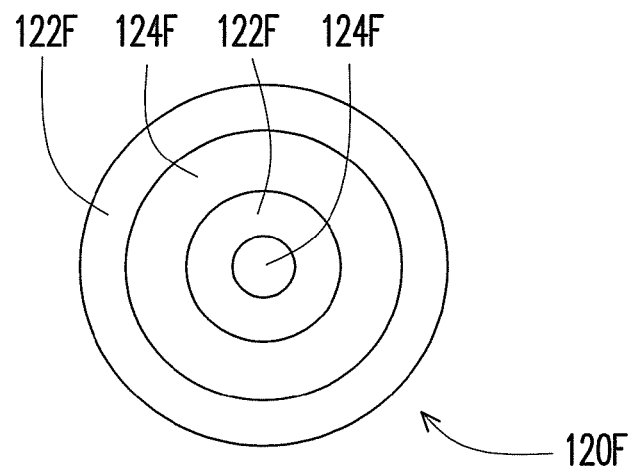
FIG. 7B is a top view of the UBM layer of FIG. 7A.

FIG. 7A is a schematic cross-sectional view of a package carrier according to another embodiment. FIG. 7B is a top view of the UBM layer of FIG. 7A. Referring to both FIGS. 7A and 7B, in the embodiment, a package carrier 100F of FIG. 7A is similar to the package carrier 100A of FIG. 2A. The difference between the two package carriers lies in that a UBM layer 120F of the package carrier 100F in FIG. 7A has a first conductive pattern 122F and a second conductive pattern 124F both being multiple-ring structures with no space therebetween, and the first conductive pattern 122F and the second conductive pattern 124F are interlaced with each other. In the embodiment, the first conductive pattern 122F is constituted by ring patterns, the second conductive pattern 124F is constituted by a column pattern and a ring pattern, wherein the ring patterns of the first conductive pattern 122F and the column pattern and ring pattern of the second conductive pattern 124F are interlaced with each other and are coaxial.

Figure 8A:
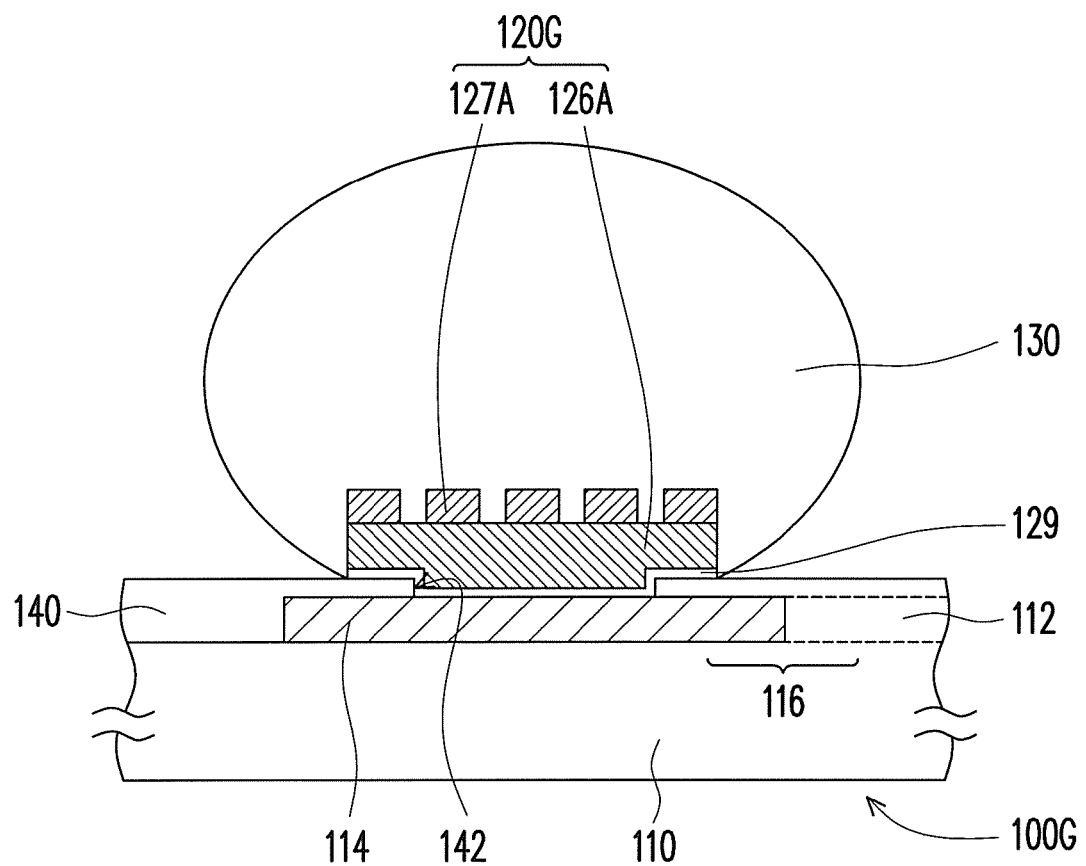
FIG. 8A is a schematic cross-sectional view of a package carrier according to another embodiment.
Figure 8B:
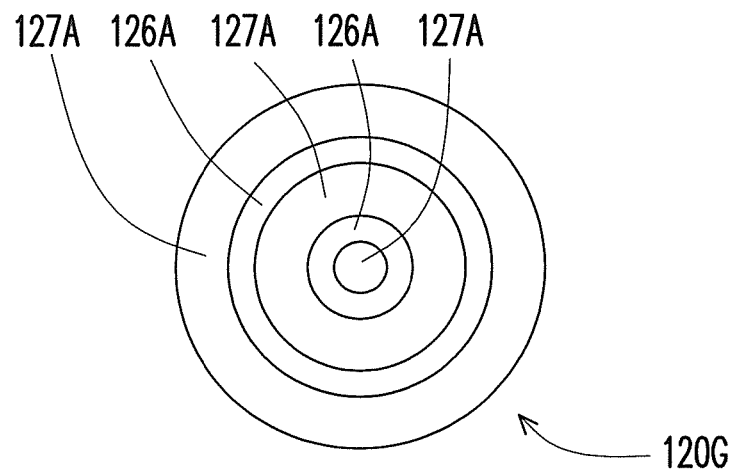
FIG. 8B is a top view of the UBM layer of FIG. 8A.

FIG. 8A is a schematic cross-sectional view of a package carrier according to another embodiment. FIG. 8B is a top view of the UBM layer of FIG. 8A. Referring to both FIGS. 8A and 8B, in the embodiment, a package carrier 100G of FIG. 8A is similar to the package carrier 100A of 2A. The difference between the two package carriers lies in that a UBM layer 120G of the package carrier 100G of FIG. 8A has a conductive pattern 126A and a multiple-ring structure 127A on the conductive pattern 126A. In details, the conductive pattern 126A is a block pattern. The conductive pattern 127A is constituted by ring patterns, the ring patterns of the conductive pattern 127A are coaxial, and the adjacent ring patterns have a space therebetween.

In detail, according to the embodiment, the conductive pattern 126A is located on a surface of the pad 114, and the multiple-ring structure 127A is located on a surface of the conductive pattern 126A. The conductivity of the multiple-ring structure 127A is smaller than that of the conductive pattern 126A, and a portion of the multiple-ring structure 127A is close to the signal source region 116. Moreover, the area of the multiple-ring structure 127A occupies 5%-60% of the entire area of the UBM layer 120G. The materials of the conductive pattern 126A and the multiple-ring structure 127A are selected respectively from Cu, Ag, Ni, Al, Ti, W, Cr, Au, Zn, Bi, In, Tn and an alloy of any of the foregoing metals.

The embodiment shown by FIGS. 7A and 7B and the embodiment shown by FIGS. 8A and 8B are both designed as having multiple-ring structure(s). The multiple-ring structure(s) not only effectively improves on current crowding of the UBM layer in the signal source region, but also divides the current so that the current uniformly passes through the UBM layer.

Figure 9A:
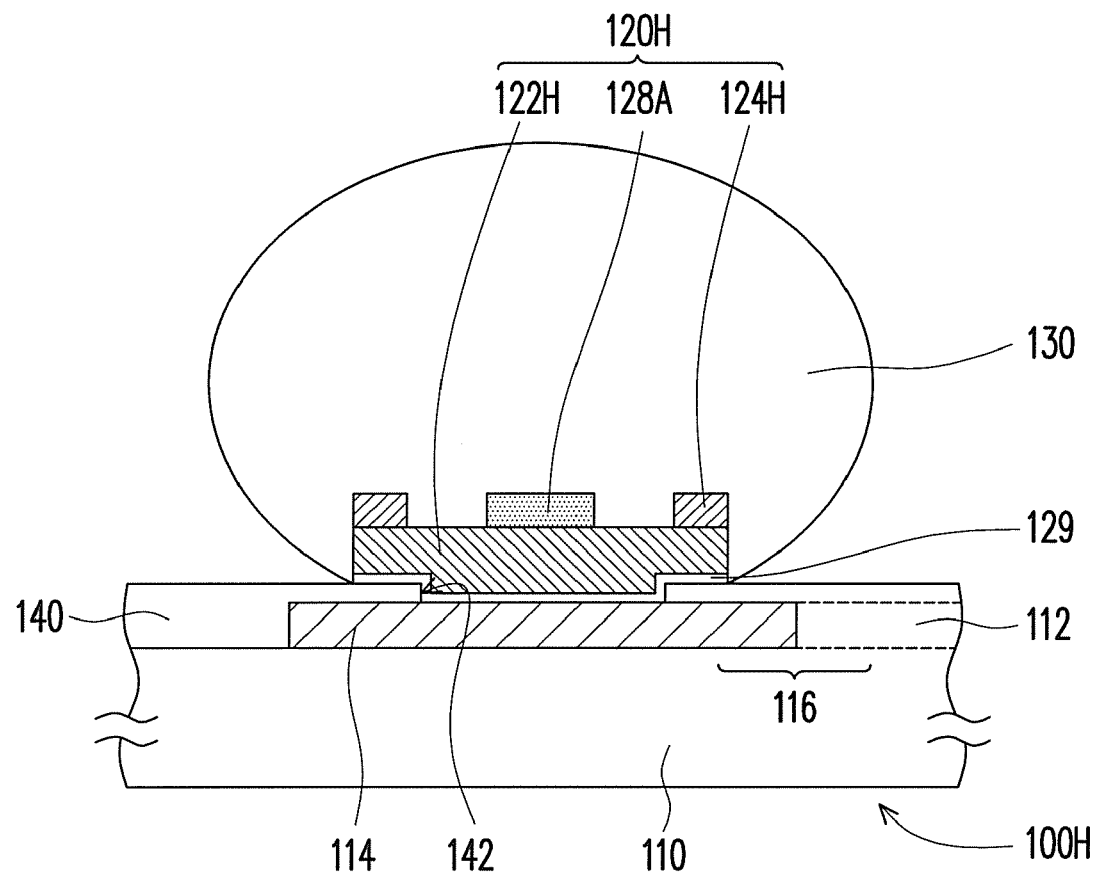
FIG. 9A is a schematic cross-sectional view of a package carrier according to another embodiment.
Figure 9B:
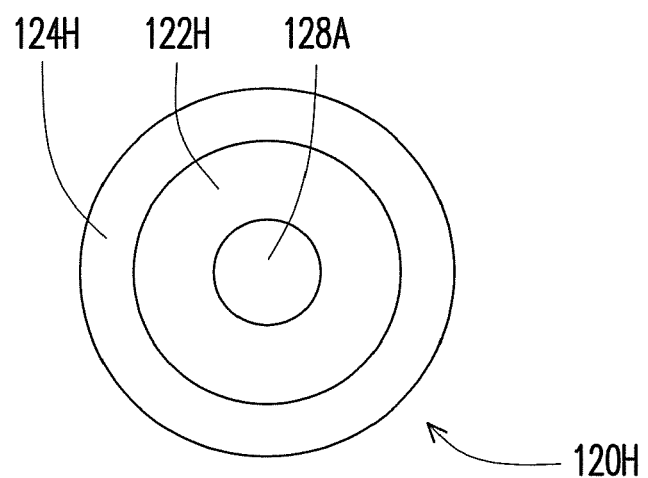
FIG. 9B is a top view of the UBM layer of FIG. 9A.

FIG. 9A is a schematic cross-sectional view of a package carrier according to another embodiment. FIG. 9B is a top view of the UBM layer of FIG. 9A. Referring to both FIGS. 9A and 9B, in the embodiment, a package carrier 100H of FIG. 9A is similar to the package carrier 100A of FIG. 2A. The difference between the two package carriers lies in that a UBM layer 120H of the package carrier 100H of FIG. 9A further includes a third conductive pattern 128A, and a second conductive pattern 124H is located at two sides of the upper surface of a first conductive pattern 122H. That is, the third conductive pattern 128A and the second conductive pattern 124H are located on the upper surface of the first conductive pattern 122H, the second conductive pattern 124H is a ring structure, and the first conductive pattern 122H is a column structure. The third conductive pattern 128A is located in the middle of the upper surface of the first conductive pattern 122H, and the third conductive pattern 128A is located at the center of the upper surface of the second conductive pattern 124H. The conductivity of the third conductive pattern 128A is larger than that of the first conductive pattern 122H; the conductivity of the first conductive pattern 122H is larger than that of the second conductive pattern 124H, and the second conductive pattern 124H is closer to the signal source region 116 than the third conductive pattern 128A. Furthermore, the material of the third conductive pattern 128A can be selected from Cu, Ag, Ni, Al, Ti, W, Cr, Au, Zn, Bi, In, Tn and an alloy of any of the foregoing metals.

Figure 10A:
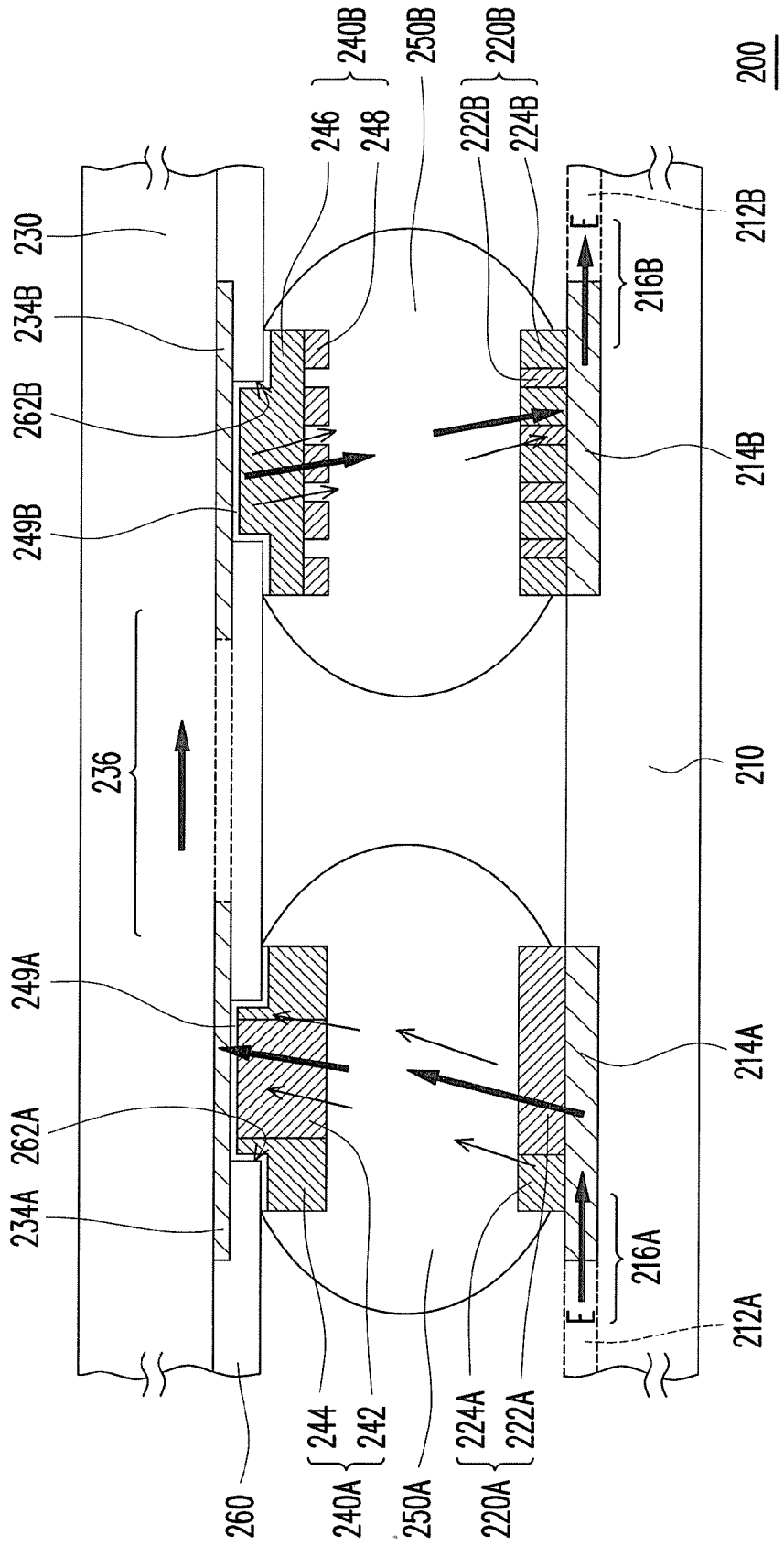
FIG. 10A is a schematic cross-sectional view of a bonding structure according to an embodiment.
Figure 10B:
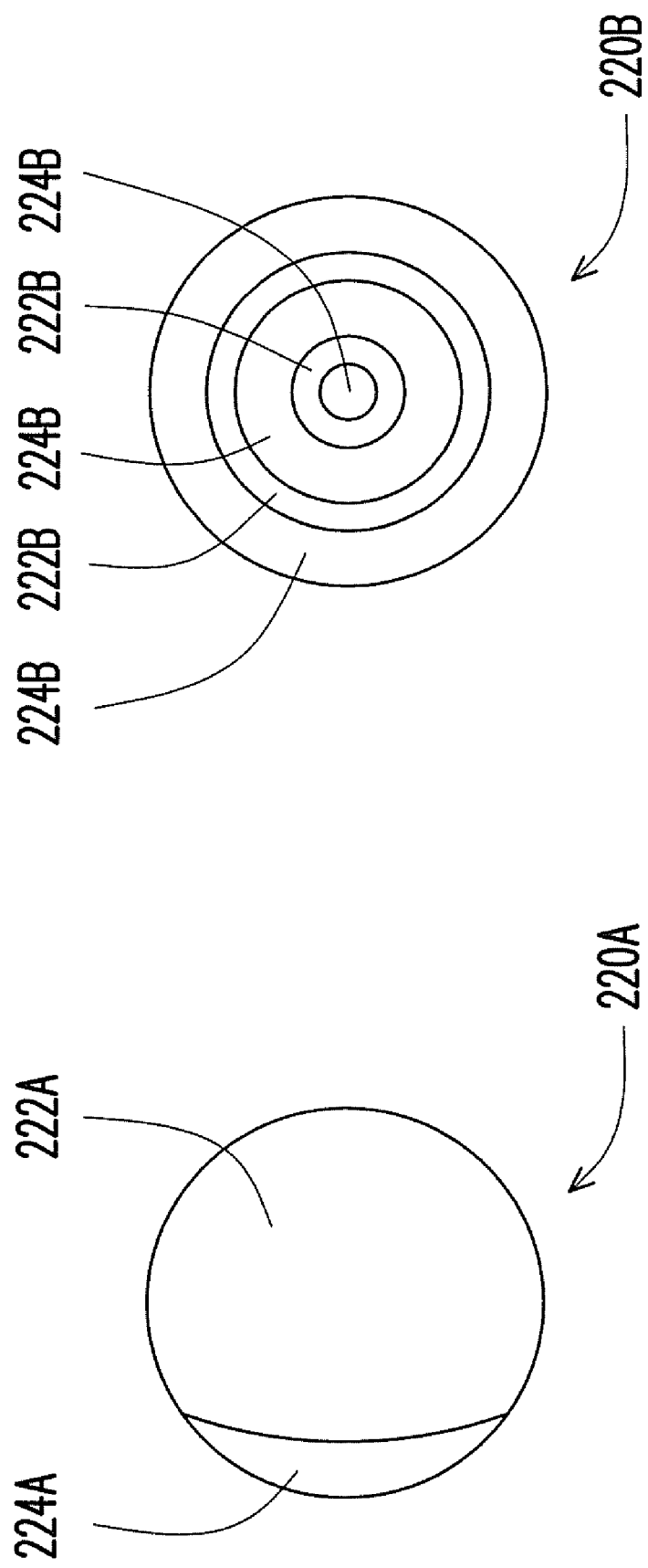
FIG. 10B is a top view of the first UBM layer of FIG. 10A.
Figure 10C:
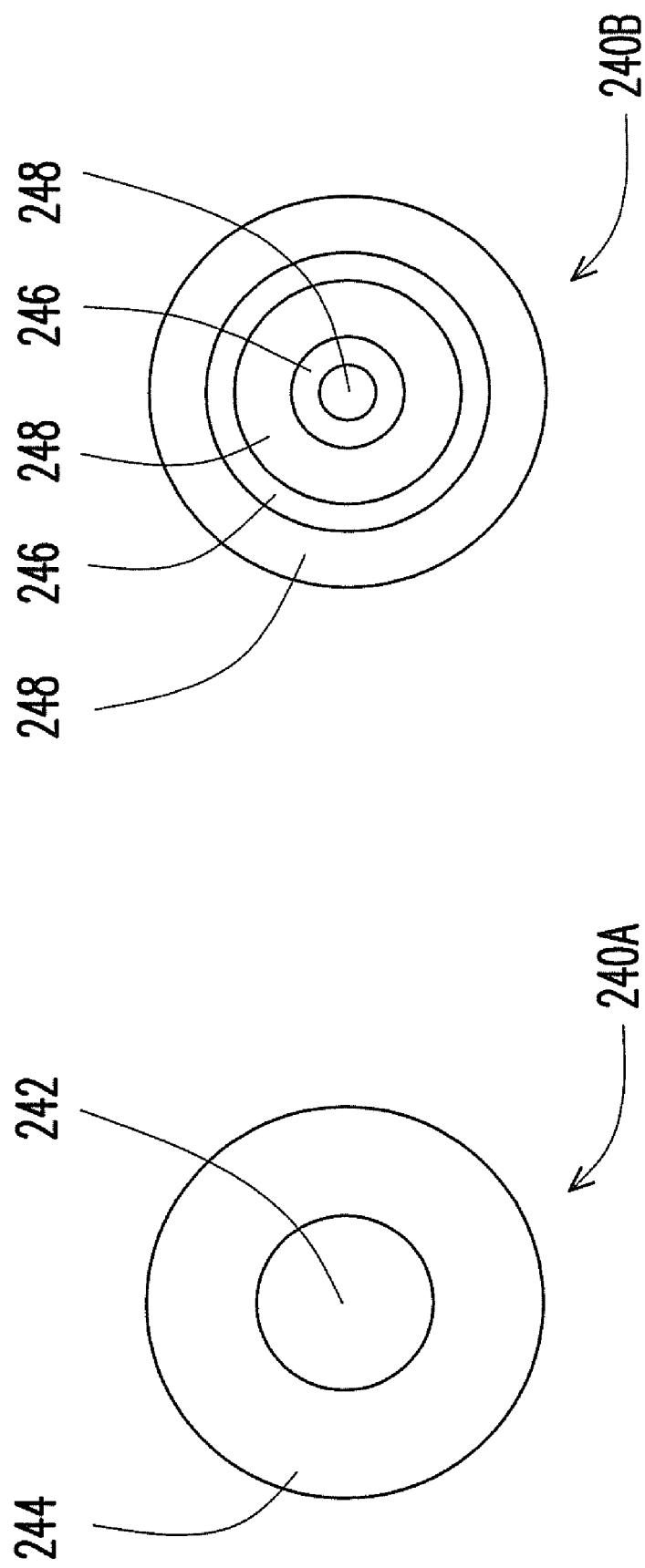
FIG. 10C is a top view of the second UBM layer of FIG. 10A.

FIG. 10A is a schematic cross-sectional view of a bonding structure according to an embodiment. FIG. 10B is a top view of the first UBM layer of FIG. 10A. FIG. 10C is a top view of the second UBM layer of FIG. 10A. Referring to FIG. 10A first, in the embodiment, a bonding structure 200 includes a first substrate 210, first UBM layers 220A and 220B, a second substrate 230, second UBM layers 240A and 240B, conductive bumps 250A and 250B and a passivation layer 260.

The first substrate 210 has first conductive structures 212A and 212B and first pads 214A and 214B connected with the first conductive structures 212A and 212B respectively. Regions of the first pads 214A and 214B connected with the first conductive structures 212A and 212B are first signal source regions 216A and 216B. In the embodiment, the first substrate 210 is a chip, and the first pads 214A and 214B, and the first conductive structures 212A and 212B are all embedded in the surface of the first substrate 210.

Referring to FIGS. 10A and 10B, in the embodiment, the first UBM layers 220A and 220B are disposed on the first pads 214A and 214B respectively. The first UBM layers 220A and 220B respectively include first conductive patterns 222A and 222B, and second conductive patterns 224A and 224B. The side walls of the second conductive patterns 224A and 224B are directly connected to the side walls of the first conductive patterns 222A and 222B. The second conductive patterns 224A and 224B are disposed close to signal source regions 216A and 216B. The first conductive patterns 222A and 222B, and the second conductive patterns 224A and 224B are all single-layered structures. The conductivities of the second conductive patterns 224A and 224B are smaller than those of the first conductive patterns 222A and 222B. In other embodiments, the first conductive patterns 222A and 222B, and the second conductive patterns 224A and 224B can also be multilayer structures. Moreover, the area of the second conductive patterns 224A and 224B occupies 5%-60% of the entire area of the UBM layers 220A and 220B.

According to the embodiment, a side wall of the first conductive pattern 222A in the UBM layer 220A is directly connected to a side wall of the second conductive pattern 224A, and the upper surface of the first conductive pattern 222A is co-planar with that of the second conductive pattern 224A. The first conductive pattern 222B and the second conductive pattern 224B of the UBM layer 220B are both multiple-ring structures, and the first conductive pattern 222B and the second conductive pattern 224B are interlaced with each other. The materials of the first conductive patterns 222A and 222B and the materials of the second conductive patterns 224A and 224B are respectively selected from Cu, Ag, Ni, Al, Ti, W, Cr, Au, Zn, Bi, In, Tn and an alloy of any of the foregoing metals.

The second substrate 230 is disposed opposite to the first substrate 210 and has a second conductive structure 232 and two second pads 234A and 234B connected with the second conductive structure 232. Regions of the second pads 234A and 234B connected with the second conductive structure 234 are a second signal source region 236. In the embodiment, the second substrate 230 is a chip, and the second pads 234A and 234B, and the second conductive structure 232 all protrude from the surface of the second substrate 230. Further, in the bonding structure 200 of the embodiment, on the surface of the second substrate 230 further includes a passivation layer 260. The passivation layer 260 has two openings 262A and 262B, and the openings 262A and 262B respectively expose a portion of the second pads 234A and 234B.

Referring to FIGS. 10A and 10C, in the embodiment, second UBM layers 240A and 240B are respectively disposed on the second pads 234A and 234B. A portion of the second UBM layers 240A and 240B is located on the second pads 234A and 234B exposed by the openings 262A and 262B located on the passivation layer 260. The other portion of the second UBM layers 240A and 240B is located on the passivation layer 260 above the second pads 234A and 234B.

Furthermore, the second UBM layer 240A includes a third conductive pattern 242 and a fourth conductive pattern 244. The side wall of the fourth conductive pattern 244 is directly connected to that of the third conductive pattern 242, and the fourth conductive pattern 244 is disposed close to the second signal source region 236. The third conductive pattern 242 and the fourth conductive pattern 244 are both single-layered structures. The conductivity of the fourth conductive pattern 244 is smaller than that of the third conductive pattern 242. In other embodiments, the third conductive pattern 242 and the fourth conductive pattern 244 can also be multilayer structures. In the embodiment, the fourth conductive pattern 244 is disposed around the third conductive pattern 242, and the upper surface of the fourth conductive pattern 244 is coplanar with that of the third conductive pattern 242. That is, the fourth conductive pattern 244 and the third conductive pattern 242 are coaxial. Additionally, the area of the fourth conductive pattern 244 occupies 5%-60% of the entire area of the UBM layer 240A, and the materials of the third conductive pattern 242 and the fourth conductive pattern 244 are respectively selected from Cu, Ag, Ni, Al, Ti, W, Cr, Au, Zn, Bi, In, Tn and an alloy of any of the foregoing metals.

The second UBM layer 240B includes a conductive pattern 246 and a multiple-ring structure 248. The conductive pattern 246 is located on the surface of the second pad 234B, and the multiple-ring structure 248 is located on the surface of the conductive pattern 246. The conductivity of the multiple-ring structure 248 is smaller than that of the conductive pattern 246, and a portion of the multiple-ring structure 248 is close to the second signal source region 236. According to the embodiment, the area of the multiple-ring structure 248 occupies 5%-60% of the entire area of the UBM layer 240B, and the materials of the conductive pattern 246 and the multiple-ring structure 248 are respectively selected from Cu, Ag, Ni, Al, Ti, W, Cr, Au, Zn, Bi, In, Tn and an alloy of any of the foregoing metals.

Referring again to FIG. 10A, in the embodiment, conductive bumps 250A and 250B are respectively disposed between the first UBM layers 220A and 220B, and between the second UBM layers 240A and 240B. The current E from the first signal source region 216A of the first substrate 210 sequentially passes through the first pad 214A, the first UBM layer 220A, the conductive bump 250A, the second UBM layer 240A and the second pad 234A and then enters the second substrate 230. Afterwards, the current E from the second signal source region 236 sequentially passes through the second pad 234B, the second UBM layer 240B, the conductive bump 250B, the first UBM layer 220B, the first pad 214B and then returns to the first substrate 210. In other words, the first substrate 210 and the second substrate 230 can be electrically connected with each other through the conductive bumps 250A and 250B.

Moreover, in the embodiment, the UBM layers 240A and 240B further include adhesive layers 249A and 249B. The adhesive layers 249A and 249B are respectively disposed between the UBM layers 240A and 240B, and between the second pads 234A and 234B to strengthen the bonding between the UBM layers 240A and 240B, and between the second pads 234A and 234B.

It is to be noted that the embodiment does not limit the forms of the first UBM layers 220A and 220B and those of the second UBM layers 240A and 240B. As long as the structure designs enable the current E to distribute uniformly inside the first UBM layers 220A and 220B, and the second UBM layers 240A and 240B, they all fall within the scope of the embodiment for which protection is sought. Therefore, refer to FIGS. 3A-9A for other design choices to replace or combine the first UBM layers 220A and 220B and the second UBM layers 240A and 240B of FIG. 10A. [0065] Moreover, the first UBM layers 220A and 220B, the second UBM layers 240A and 240B, and the conductive bumps 250A and 250B described in the bonding structure 200 of the embodiment are all realized by two, but in other embodiments now shown herein, there can also be one or more than two first UBM layers, second UBM layers and conductive bumps.

Figure 10D:
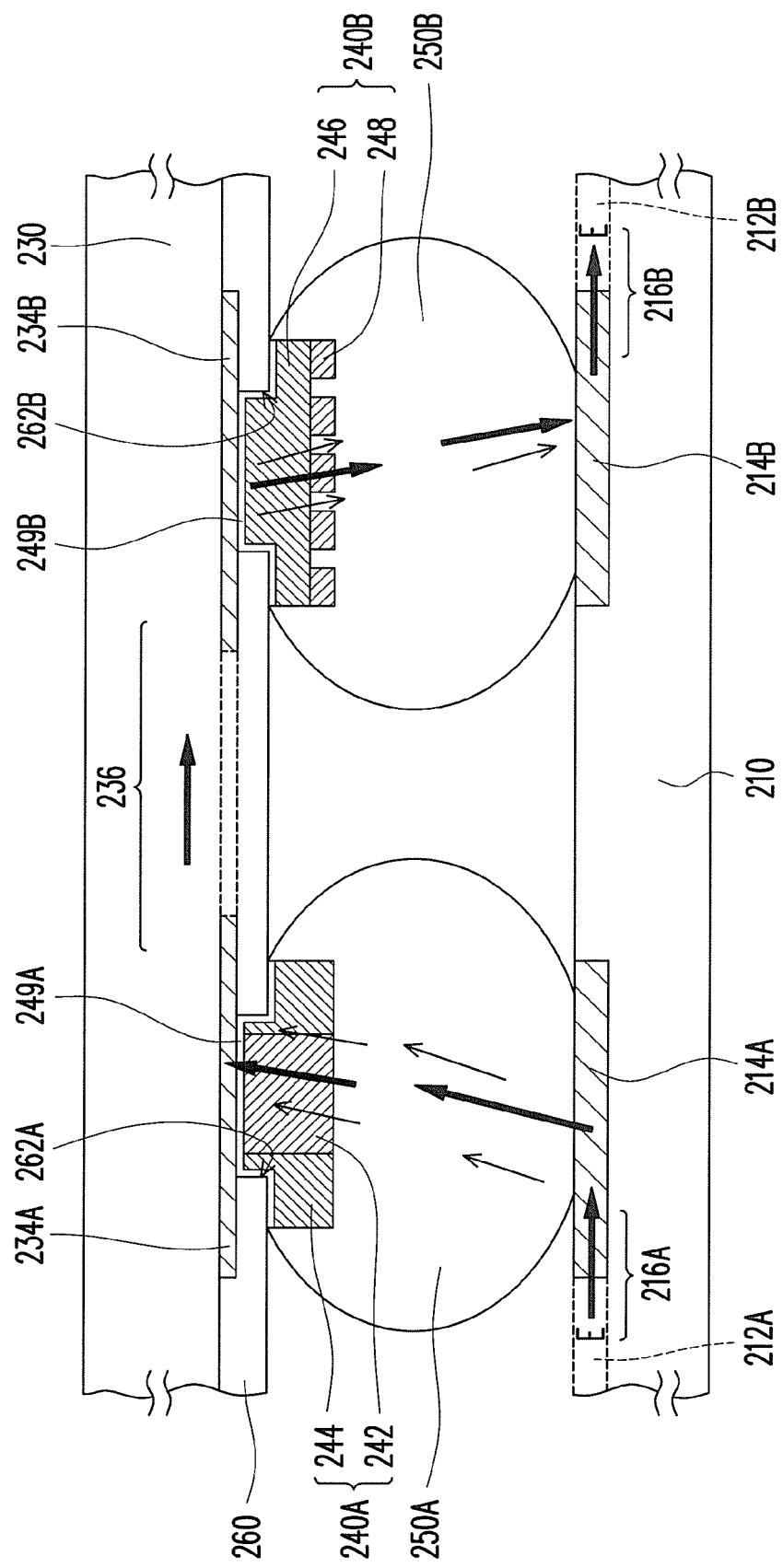
FIG. 10D is a schematic cross-sectional view of a bonding structure according to another embodiment.

Furthermore, the first substrate 210 and the second substrate 230 described in the bonding structure 200 of the embodiment are both realized by a chip. However, in other embodiments, the first substrate 210 and the second substrate 230 may also be a combination of a circuit board and a chip as shown in FIG. 10D. In FIG. 10D, a first substrate 210' is a circuit board, and a second substrate 230' is a chip, for example. The difference between the first substrate 210' of FIG. 10D and the first substrate 210 of FIG. 10A lies in that the first substrate 210' does not have the UBM layers 220A and 220B. Hence, the forms of the first substrates 210 and 210' and those of the second substrate 230 and 230' as shown in FIGS. 10A and 10D are enumerated for illustration and not intended to limit the embodiment.

The first UBM layers 220A and 220B of the bonding structure 200 in the embodiment have the first conductive patterns 222A and 222B and the second conductive patterns 224A and 224B having two different conductivities. The second UBM layers 240A and 240B respectively have the third conductive pattern 242 and the fourth conductive pattern 244 with two different conductivities, or the conductive pattern 246 and the multiple-ring structure 248. The conductivities of the second conductive patterns 224A and 224B, the conductivity of the fourth conductive pattern 244, and the conductivity of the multiple-ring structure 248 are smaller than those of the first conductive patterns 222A and 222B, that of the third conductive pattern 242 and that of the conductive pattern 246 respectively. The second conductive patterns 224A and 224B, the fourth conductive pattern 244 and the multiple-ring structure 248 are respectively disposed close to the first signal source regions 216A and 216B or the second signal source region 236. Therefore, when the current E from the first signal source region 216A enters the first UBM layers 220A and 220B and the second UBM layers 240A and 240B, the amount of the current E flowing close by the first signal source regions 216A and 216B and the second signal source region 236 is smaller than the amount of the current E flowing far away from the first signal source regions 216A and 216B and the second signal source region 236. As a result, the density of the current E is uniformly distributed in the first UBM layers 220A and 220B and the second UBM layers 240A and 240B, thus effectively improving current crowding. At the same time, damage to the first UBM layers 220A and 220B and the second UBM layers 240A and 240B near the first signal source regions 216A and 216B and the second signal source region 236 caused by electro-migration is reduced so that the reliability of the bonding structure 200 is enhanced.

In summary, the UBM layer of the embodiment includes the conductive patterns having two different conductivities. The conductive patterns are a single-layered structure or a multilayer structure, and the conductive patterns having low conductivity are disposed close to the signal source region. Therefore, when the current from the signal source region enters the UBM layers, the amount of current flowing close by the signal source region is smaller than that flowing far away from the signal source region such that the current density is uniformly distributed in the UBM layer. The package carrier and the bonding structure of the embodiment are capable of making the density of the current passing through the pads and entering the UBM layers distribute uniformly so that current crowding is mitigated and damage to the UBM layers near the signal source region caused by electro-migration is also reduced simultaneously, which in turn enhances the reliability of the package carrier and the bonding structure.

It will be apparent to those skilled in the art that various modifications and variations can be made to the structure of the embodiment without departing from the scope or spirit of the embodiment. In view of the foregoing, it is intended that the embodiment cover modifications and variations of this embodiment provided they fall within the scope of the following claims and their equivalents.

What is claimed is:

1. A package carrier, comprising:
   a substrate, having a conductive structure and at least one pad connected with the conductive structure, wherein a region of the pad connected with the conductive structure is a signal source region;
   at least one under bump metallurgic (UBM) layer, disposed on the pad, the under bump metallurgic layer comprising:
   a first conductive pattern;
   a second conductive pattern, a side wall of the second conductive pattern being directly connected to a side wall of the first conductive pattern, the second conductive pattern being disposed close to the signal source region, wherein a conductivity of the second conductive pattern is smaller than a conductivity of the first conductive pattern; and
   at least one conductive bump, disposed on the under bump metallurgic layer.

2. The package carrier as claimed in claim 1, wherein the first and the second conductive patterns are respectively a single-layered structure or a multilayer structure.

3. The package carrier as claimed in claim 1, wherein the second conductive pattern is located around or at a side of the first conductive pattern.

4. The package carrier as claimed in claim 3, wherein an upper surface of the second conductive pattern is co-planar with an upper surface of the first conductive pattern.

5. The package carrier as claimed in claim 3, wherein an upper surface of the second conductive pattern is higher than an upper surface of the first conductive pattern.

6. The package carrier as claimed in claim 3, wherein an upper surface of the second conductive pattern is lower than an upper surface of the first conductive pattern.

7. The package carrier as claimed in claim 1, wherein the second conductive pattern is located around or at a side of the first conductive pattern, and the second conductive pattern further extends to a portion of an upper surface of the first conductive pattern.

8. The package carrier as claimed in claim 7, wherein the second conductive pattern has a column space therein, and the first conductive pattern is disposed inside the column space and extends to a portion of the upper surface of the first conductive pattern, such that a column recess enclosed by the second conductive pattern is formed on the upper surface of the first conductive pattern.

9. The package carrier as claimed in claim 1, wherein the second conductive pattern is located around or at a side of the first conductive pattern, and the first conductive pattern further extends to a portion of an upper surface of the second conductive pattern.

10. The package carrier as claimed in claim 1, wherein the second conductive pattern has a column space therein, and the first conductive pattern is disposed inside the column space and extends to a portion of the upper surface of the second conductive pattern, such that a ring recess surrounding the first conductive pattern is formed on the upper surface of the second conductive pattern.

11. The package carrier as claimed in claim 1, wherein the first conductive pattern and the second conductive pattern are both multiple-ring structures, and the first and the second conductive patterns are interlaced with each other with no space therebetween.

12. The package carrier as claimed in claim 11, wherein the first conductive pattern is constituted by ring patterns, the second conductive pattern is constituted by a column pattern and a ring pattern, and the ring patterns of the first conductive pattern and the column pattern and ring pattern of the second conductive pattern are interlaced with each other and are coaxial.

13. The package carrier as claimed in claim 1, wherein the under bump metallurgic layer further comprises an adhesive layer disposed between the under bump metallurgic layer and the pad.

14. The package carrier as claimed in claim 1, wherein the substrate is a chip or a circuit board.

15. The package carrier as claimed in claim 1, wherein materials of the first conductive pattern and the second conductive pattern are respectively selected from Cu, Ag, Ni, Al, Ti, W, Cr, Au, Zn, Bi, In, Tn and an alloy of any of the foregoing metals.

16. The package carrier as claimed in claim 1, wherein an area of the second conductive pattern occupies 5%-60% of an entire area of the under bump metallurgic layer.

17. The package carrier as claimed in claim 1, wherein the conductive structure and the at least one pad belong to the same layer.

18. The package carrier as claimed in claim 1, wherein the conductive structure is a conducting structure located inside the substrate.

19. The package carrier as claimed in claim 1, further comprising a passivation layer on the substrate, wherein the passivation layer has an opening exposing a portion of the at least one pad.

20. The package carrier as claimed in claim 16, wherein a portion of the UBM layer is located on the at least one pad exposed by the opening of the passivation layer, and another portion of the UBM layer is located on the passivation layer over the at least one pad.

21. The package carrier as claimed in claim 1, wherein the conductive bump is electrically connected with the substrate through the UBM layer, and the conductive bump comprises lead-tin alloy.

22. The package carrier as claimed in claim 1, wherein the UBM layer is a column structure.

23. The package carrier as claimed in claim 1, wherein the first conductive pattern is located at the center of the second conductive pattern.

* * * * *